Figure 1:
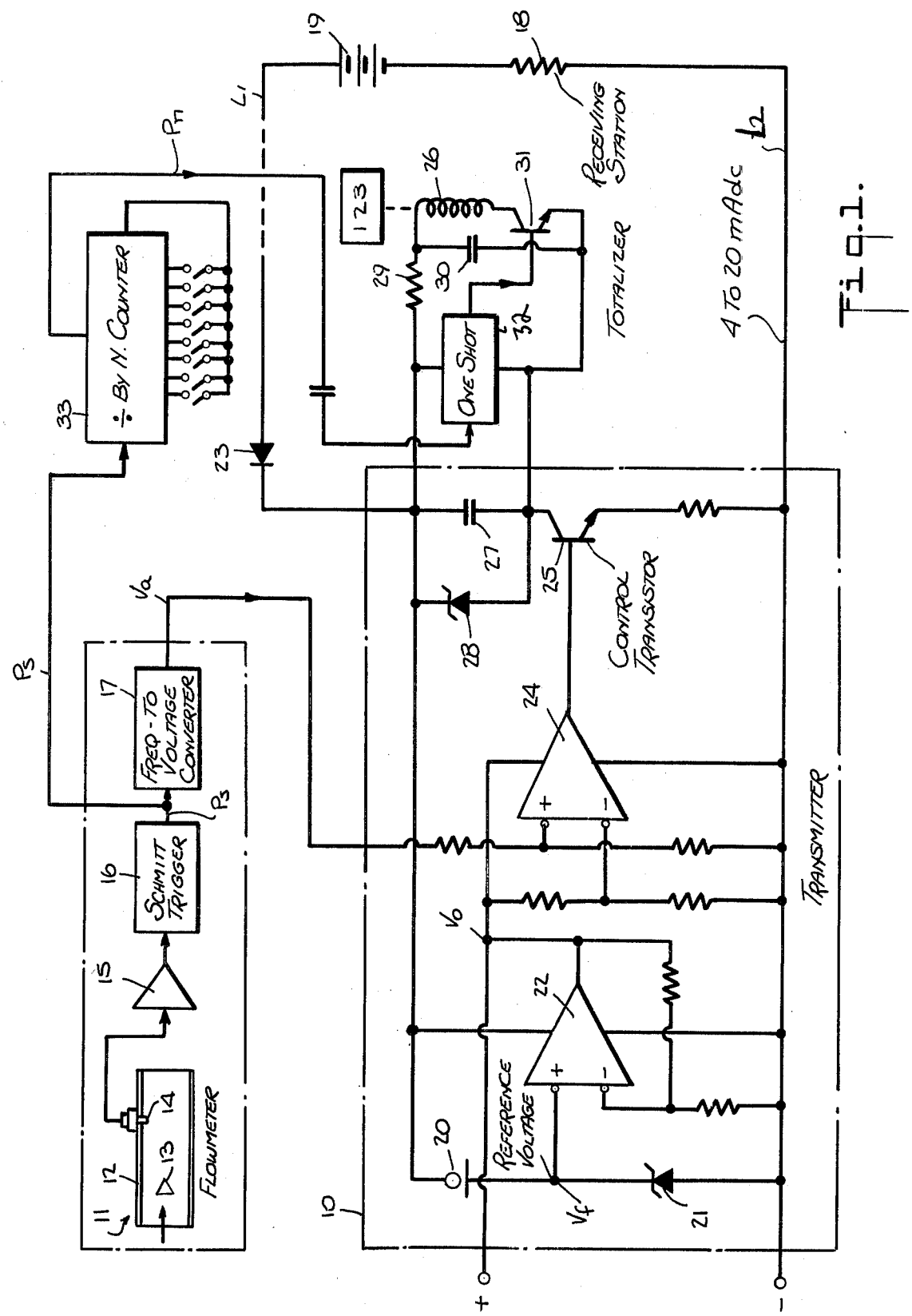

United States Patent [19]

Herzl et al.

[11] 4,084,155
[45] Apr. 11, 1978

[54] TWO-WIRE TRANSMITTER WITH TOTALIZING COUNTER

[75] Inventors: Peter J. Herzl, Morrisville; Robert G. Shaffer, New Britain, both of Pa.

[73] Assignee: Fischer & Porter Co., Warminster, Pa.

[21] Appl. No.: 729,778

[22] Filed: Oct. 5, 1976

[51] Int. Cl.² .................. G01F 1/32; G01R 23/06; G08C 19/02
[52] U.S. Cl. .................. 340/210; 235/92 FL; 73/194 VS
[58] Field of Search .......... 340/191, 210; 235/92 P, 235/92 FL; 320/1, 51; 73/194 VS

[56] References Cited

U.S. PATENT DOCUMENTS

| 3,783,248 | 1/1974 | Sugden, Jr. | 235/92 FL |
| 3,873,814 | 3/1975 | Mirdadian | 235/92 FL |
| 3,948,098 | 4/1976 | Richardson | 340/210 X |

Primary Examiner—Donald J. Yusko

[57] ABSTRACT

A two-wire transmitter operating in conjunction with a meter whose output signal varies in frequency as a function of the metered variable. The meter signal is changed into an analog voltage that is converted by the transmitter into a corresponding output current and conveyed to a receiving station over a two-wire line which also supplies operating voltage to the transmitter. In the transmitter, the analog voltage is applied to a differential amplifier which converts the voltage into an output current via a transistor acting as a variable impedance across the line to make up the difference between the operating current drawn by the transmitter and the output current. This make-up current is stored to provide an energy source for operating a totalizing counter coupled to the meter to determine the total amount of the variable passing through the meter.

9 Claims, 3 Drawing Figures

TWO-WIRE TRANSMITTER WITH TOTALIZING COUNTER

BACKGROUND OF INVENTION

This invention relates generally to two-wire electronic transmitters adapted to convert an analog voltage representing a metered value into a corresponding current which is conveyed over a pair of wires to a receiving station, and more particularly to a transmitter of this type which incorporates a counter to totalize the metered value without disturbing the operation of the transmitter.

Two-wire transmitters are useful in process control systems for converting a sensed value into a current signal which is transmitted to a receiving station for operating indicators, recorders, and process control systems. One important advantage of a two-wire transmitter of this type is that the same wires serve not only to convey the current signal from the transmitter to the station but also to conduct a direct operating voltage from a power supply to the station to the transmitter.

The dual use of the power supply leads as the signal output eliminates the need for extra wires in remote signal applications. Also, a current output minimizes susceptibility to voltage noise spikes and eliminates line drop problems. A typical, commercially-available, two-wire transmitter making use of linear integrated circuits is the model LH 0045/LH 0045 C two-wire transmitter manufactured by National Semiconductor Corporation and described in their instruction bulletin covering this transmitter.

In many practical applications for a two-wire transmitter, the metered value to be conveyed is the output of a measuring instrument which is expressed in terms of a signal of varying frequency. For example, among the flowmeters which yield an output voltage whose frequency is proportional to flow rate are positive displacement meters, such as those operating on the turbine principle. Also, in a swirl type or vortex-shedding flowmeter in which fluidic oscillations are produced in a flow tube, these oscillations are converted by a transducer into an electrical signal whose frequency depends on flow rate.

In order to transmit a varying-frequency signal, the signal must first be changed into an analog voltage whose magnitude varies as a function of frequency, this voltage then being converted in the transmitter into a corresponding current, usually in the range of 4 to 20 mAdc, and in some instances in the range of 10 to 50 mAdc.

It is important in some industrial applications for billing or other purposes to determine the total flow that has passed through the meter. While a total flow reading may be obtained by means of a totalizing counter associated with the meter, it has not heretofore been possible to incorporate a totalizing counter in a two-wire transmitter without disturbing the normal operation thereof.

SUMMARY OF INVENTION

In view of the foregoing, it is the main object of this invention to provide a two-wire electronic transmitter to convert an analog voltage representing a metered value into a corresponding current, the transmitter having incorporated therein a counter to totalize the metered value without disturbing the operation of the transmitter.

More particularly, it is an object of this invention to provide a transmitter operating in conjunction with a meter whose output is expressed in terms of a signal of varying frequency, which signal is transformed into an analog voltage which is converted into a corresponding current.

A significant feature of the invention is that the totalizing counter is a digital counter which responds to a submultiple of the meter signal and is powered by energy derived from the transmitter without interfering with the output current thereof. Yet another object of the invention is to provide a digital totalizing counter in a transmitter operating in conjunction with a meter producing an analog output signal.

Also an object of the invention is to provide an efficient, reliable and low-cost transmitter which incorporates a totalizing counter.

Briefly stated, these objects are accomplished in a two-wire transmitter operating in conjunction with a meter whose output signal varies in frequency as a function of the meter variable, the signal frequency being divided to provide count pulses at a relatively low rate to a totalizing digital counter.

The signal frequency is transformed into an analog voltage which is applied to the differential amplifier of the transmitter which converts the analog voltage into an output current via a transistor that acts as a variable impedance across the two-wire line to make up the difference between the operating current drawn by the transmitter and the output current. This make-up current is stored to provide an energy source for powering the totalizing counter which is actuated by the count pulses.

OUTLINE OF DRAWINGS

Figure 2:
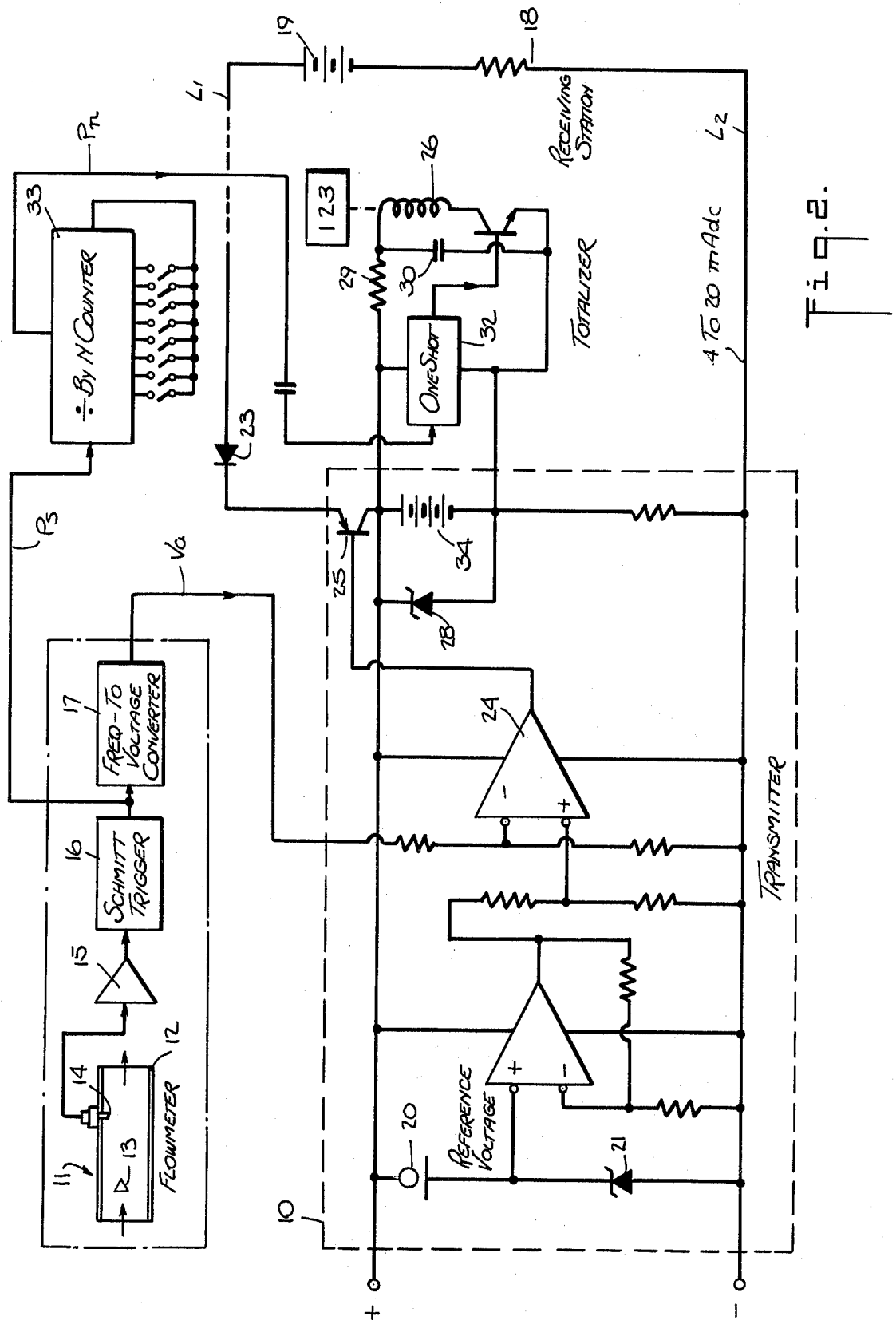

For a better understanding of the invention as well as other objects and further features thereof, reference is made to the following detailed description to be read in conjunction with the accompanying drawings, wherein:

FIG. 1 schematically illustrates one preferred embodiment of a two-wire transmitter associated with a meter and provided with a totalizing counter;

FIG. 2 schematically shows a second embodiment of the invention; and

Figure 3:
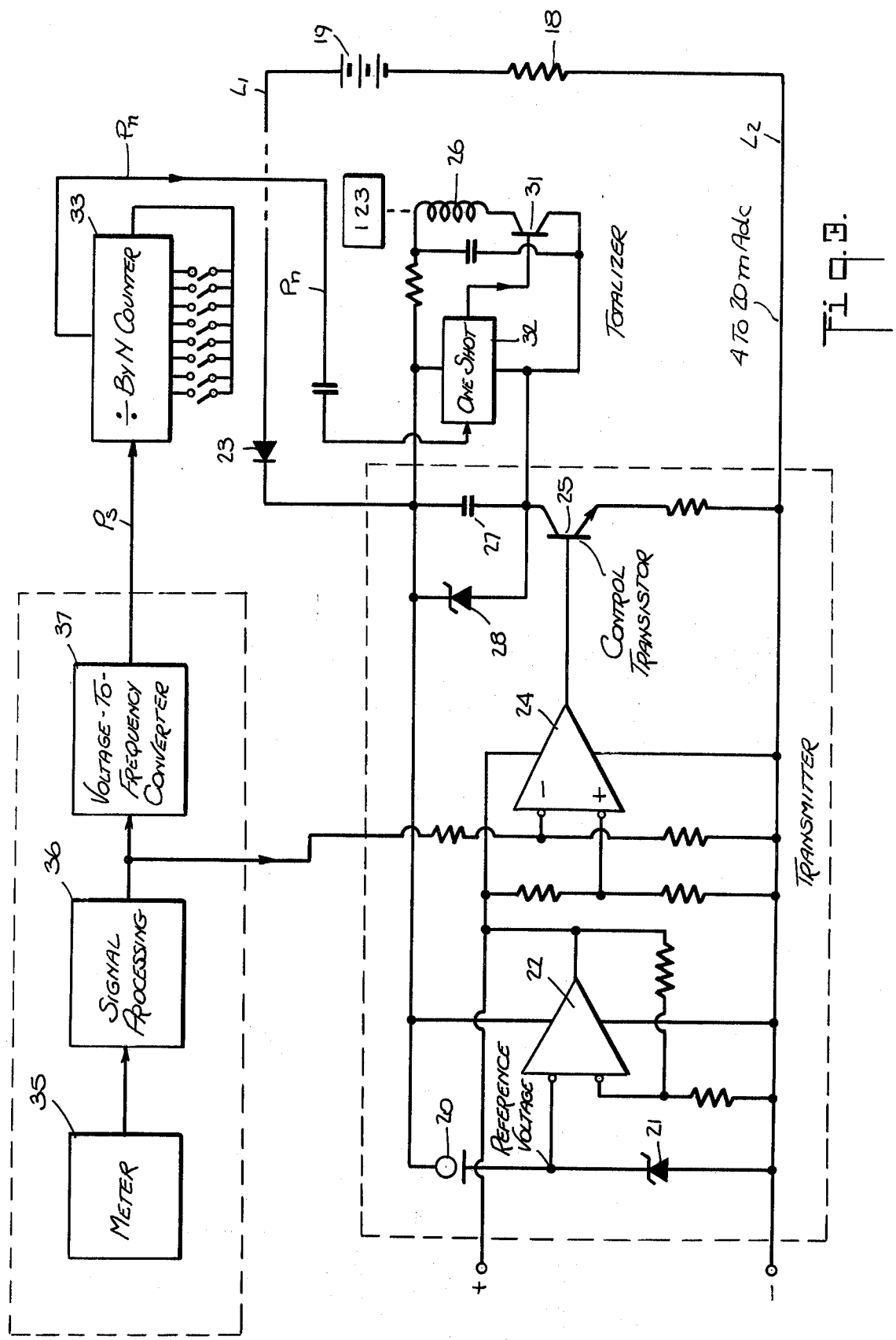

FIG. 3 is a schematic diagram of a third embodiment of the invention.

DESCRIPTION OF INVENTION

First Embodiment

Referring now to FIG. 1, there is shown a preferred embodiment of a two-wire transmitter, generally designated by numeral 10, operating in conjunction with a meter whose output signal varies in frequency as a function of the metered variable. The meter may be a turbine or positive displacement flowmeter, or a swirl type or vortex-shedding flowmeter, or it may be constituted by any other type of instrument in which a change in a sensed variable is converted into a signal whose frequency reflects this change.

By way of example, FIG. 1 discloses a vortex-shedding meter 11 which includes a flow tube 12 for conducting the fluid whose flow rate is to be measured, and a bluff body 13 mounted in tube 12 and serving as a flow obstacle giving rise to vortex-shedding phenomenon. The resultant fluidic pulses are detected by a sensor 14 which may be any suitable transducer, such as a piezoelectric element adapted to generate an output signal whose frequency is proportional to flow rate. A more detailed description of a bluff-body type of vortex meter may be found in U.S. Pat. Nos. 3,116,639 and 3,587,312.

The variable-frequency output signal from meter 11 is applied to a pre-amplifier 15 whose output is fed to a Schmitt trigger 16. Schmitt trigger 16 yields square-wave pulses $P_s$ whose repetition rate corresponds to the frequency of the signal. These pulses are converted by a frequency-to-voltage coverter 17 into an analog voltage $V_a$. Thus the magnitude of the analog voltage reflects the flow rate being metered.

Transmitter 10 functions to convert analog voltage $V_a$ into a corresponding current whose intensity lies within a standard commercial range (i.e., 4 to 20 mAdc). This current is conveyed over a two-wire line $L_1$, $L_2$ to a remote receiving station represented by load resistor 18 and provided with a d-c power source 19 which supplies operating voltage to the transmitter over the same line.

Thus line $L_1$, $L_2$ not only carries the current signal from transmitter 10 to the station but it also conducts the supply voltage from the station to the transmitter. At the station, the received current, which is proportional to the metered flow rate, may be used for indicating, recording or process control or any other application.

In transmitter 10, a reference voltage $V_f$ is established at the junction of a constant-current diode 20 connected in series with a Zener diode 21. This reference voltage is applied to the positive input terminal of a differential amplifier 22 whose operating voltage is derived from remote source 19 through diode 23 over line $L_1$, $L_2$, to develop a constant voltage $V_o$ at the low-impedance output thereof.

Constant voltage $V_o$ serves as the operating voltage for a second differential amplifier 24 as well as for the signal processing stages 15, 16 and 17 coupled to meter 11 and a divide-by-N counter, to be later described. Thus the total operating current drain of transmitter 10 includes the current consumed by the signal processing and the divide-by-N stages associated with the meter. Since in practice transmitter 10 and the meter stages associated therewith are formed by integrated circuits, the total drain is less than 4 mAdc.

Analog signal $V_a$ from the output of converter 17 is fed to the positive input of differential amplifier 24 whose output is applied to the base circuit of a current-control transistor 25. This transistor acts as a variable impedance element that is effectively shunted across line $L_1$, $L_2$, whereby the output current on the line is caused to vary in accordance with the changing impedance of transistor 25, as determined by analog voltage $V_a$. Hence the output current reflects the metered flow rate.

As pointed out previously, transmitter 10 consumes less than 4 mAdc of operating current. The difference between the less-than-4 mAdc operating current and output current in the 4 to 20 mAdc range is made of by current flowing through control transistor 25. For example, if we assume that the operating current is 3 mA, then in response to an analog voltage $V_a$ representing a span going from the minimum to the maximum flow rate, the make-up current provided by transistor 25 must lie in a range extending from a minimum of 1 mA make-up value to provide a minimum output current of 4 mA to a maximum make-up value of 17 mA to provide a maximum output current of 20 mA. It will be appreciated that these values are merely by way of example.

The significant feature of the invention resides in a digital electromagnetic totalizing counter 26 which is powered by energy derived from the make-up current in a manner whereby the output current of the transmitter is substantially unaffected by the operation of the totalizer. In accordance with the invention, some of the energy contained in the make-up current passing through control transistor 25 is stored and then exploited to periodically actuate counter 26 to totalize the flow through meter 11.

To store this energy, a storage capacitor 27 is interposed in the output circuit of transistor 25, the capacitor being shunted by a Zener diode 28. In operation, the make-up current flowing through transistor 25 acts to charge capacitor 27 until the charge thereacross reaches a predetermined value, at which point Zener diode 28 is rendered conductive and the make-up current then passes through this diode. The voltage across storage capacitor 27 is applied to a filter constituted by resistor 29 and capacitor 30, whose steady output is impressed across electromagnetic counter 26 in series with a switching transistor 31 that is normally non-conductive.

Connected to the base of switching transistor 31 is the output of a one-shot device 32, such that when the one-shot device is activated to yield a single pulse, transistor 31 is rendered conductive to apply the stored voltage to counter 26 to actuate same.

The one-shot device 32 is activated by output pulses $P_n$ emerging from the divide-by-N counter 33, which is responsive to pulses $P_s$ derived from the output of Schmitt trigger 16. The number of pulses $P_s$ produced by the trigger is directly proportional to the total metered flow, whereas pulses $P_n$ have a number which is an exact submultiple of the number of pulses $P_s$, depending on the selected setting of the divide-by-N counter 33.

To give a practical example, if a flow of 100 gallons of liquid through meter 11 produces 1400 pulses $P_s$, and one wishes to totalize flow in steps of 100 gallons, then divide-by-N counter 33 is set to divide by 1400. As a consequence, one pulse $P_n$ is yielded by the counter for every 1400 $P_s$ pulses. Each pulse $P_n$ results in a single activation of the one-shot device 32 to actuate totalizing counter 26. Hence when this counter reads, say, 30, it means that a total of 3000 gallons has flowed through the meter, each count representing 100 gallons of liquid.

The amount of energy derived from the make-up current depends on the volume of flow, so that the greater the volume, the more the available energy. Since a larger flow volume results in a more frequent actuation of the totalizing counter, more energy must be reserved for this purpose. The energy system in accordance with the invention accommodates itself to these changing requirements; for if the make-up current at a given time is, say, 2 mA, this being indicative of a low volume of flow, relatively little energy is then available. But this is adequate, for it is only then necessary to actuate the totalizer infrequently. However, if the make-up current rises to, say, 16 mA, which reflects nearly a maximum flow volume, much more energy is then made available to provide for more frequent actuation of the totalizer. Thus the system works well from the energy-availability standpoint.

Second Embodiment

In the totalizer arrangement shown in FIG. 2, the transmitter is similar to that shown in FIG. 1, except that the storage capacitor 27 included in FIG. 1 is replaced by a rechargeable battery 34, and that operating power for all stages of the system and the associated totalizer is obtained from this battery.

Battery 34 is charged by the make-up current passing through control transistor 25 in the same manner in which the storage capacitor was charged in the first embodiment, the make-up current passing through Zener diode 28 when the battery attains a predetermined charge. The difference is, however, that should a power failure occur for a relatively brief period, chargeable battery 34 will continue to power the meter and the totalizer associated therewith as long as the battery is sufficiently charged. This back-up feature eliminates the risk of interrupted meter operation due to short-time power failures and it makes the meter more acceptable for billing purposes.

Third Embodiment

In the arrangement shown in FIGS. 1 and 2, transmitter 10 is associated with a meter whose output signal varies in frequency as a function of the metered variable, the variable being totalized. In the embodiment shown in FIG. 3, meter 35 is of the type which directly yields an analog voltage $V_a$ that is proportional to the metered variable; hence there is no need in this instance to convert a variable-frequency output signal to an analog voltage.

Typical of such meters are transmitting rotameters in which the vertical position of a float in a variable area flow tube is converted into an analog voltage. Also typical are differential-pressure transmitters and other instruments in which a sensed variable such as pressure, density or temperature is converted into a corresponding analog voltage by a suitable transducer. The analog voltage $V_a$ yielded by a signal-processing stage 36 associated with meter 35 and appropriate thereto is applied to the differential amplifier 24 of the transmitter and is converted therein into an output current in the manner previously described.

In order to totalize the output of meter 35, it is necessary to convert analog voltage $V_a$ into pulses $P_s$ whose number depends on the magnitude of the analog voltage. This is accomplished by a voltage-to-frequency converter 37 which produces pulses $P_s$ whose number is a function of analog voltage $V_a$. Pulses $P_s$ are applied to the divide-by-N counter 33 to produce pulses $P_n$ which serve to activate the one-shot 32 and thereby actuate totalizing counter 26 in the manner previously described. Thus in this embodiment, since the meter output signal is not of varying frequency but is an analog voltage, it can be applied directly to the input of the transmitter for conversion into an output current; but in order to operate the digital totalizer, the output signal must be converted from an analog to a digital value which is then divided to provide the count pulses to be registered by digital counter 26.

While there have been shown and described preferred embodiments of a two-wire transmitter with totalizing counter in accordance with the invention, it will be appreciated that many changes and modifications may be made therein without, however, departing from the essential spirit thereof.

I claim:

1. A transmitter responsive to an analog voltage representing a metered variable produced by an associated meter and adapted to generate a corresponding output current which is conveyed over a two-wire line to a receiving station provided with a d-c power supply whose voltage is fed over the same line to the transmitter to power the transmitter and the meter which draw a predetermined amount of operating current, said transmitter comprising:

A a control transistor effectively shunted across said line and acting as a variable impedance to vary the current carried thereby;

B an amplifier whose output is coupled to said transistor to vary the impedance thereof, said analog voltage being applied to the input of said amplifier to vary said impedance as a function thereof to cause current flow through said transistor to make up the difference between said operating current and said output current; and C a totalizer system to totalize the metered variable and including means coupled to said meter to produce count pulses whose number depends on the variable, a digital counter to register said count pulses, and means interposed between the control transistor and the line to extract energy from the make-up current flowing therethrough and to store said energy to provide a power source for energizing the totalizing system.

2. A transmitter as set forth in claim 1, wherein said means interposed between the control transistor and the line is constituted by a storage capacitor and a Zener diode shunted thereacross, said capacitor being charged by the make-up current until a point is reached where the Zener diode is rendered conductive to pass the make-up current.

3. A transmitter as set forth in claim 2 further including an R-C filter coupled to said capacitor.

4. A transmitter as set forth in claim 1, wherein said means interposed between the transistor and the line is constituted by a chargeable battery and a Zener diode shunted thereacross, said capacitor being charged by the make-up current until a point is reached where the Zener diode is rendered conductive to pass the make-up current.

5. A transmitter as set forth in claim 1, further including a normally non-conductive switching transistor connected between said digital counter and said power source, and a one-shot device responsive to said count pulses to produce a control pulse for activating the one-shot device.

6. A transmitter as set forth in claim 1, wherein said meter produces an output signal whose frequency varies in accordance with the metered variable and further including means to convert the signal to said analog voltage.

7. A transmitter as set forth in claim 6, wherein said means coupled to said meter to produce count pulses is constituted by a divide-by-N counter which is responsive to the frequency of said output signal.

8. A transmitter as set forth in claim 1, wherein said meter produces a direct-current output signal whose magnitude varies in accordance with the metered variable and constitutes the analog voltage.

9. A transmitter as set forth in claim 8, wherein said means to produce count pulses includes a voltage-to-frequency converter responsive to said analog voltage to produce said count pulses.

* * * * *